United States Patent [19]

Jasper, Jr.

[11] Patent Number: 5,030,914
[45] Date of Patent: Jul. 9, 1991

[54] ELECTRON PARAMAGNETIC RESONANCE INSTRUMENT WITH SUPERCONDUCTIVE CAVITY

[76] Inventor: Louis J. Jasper, Jr., 12389 Kondrup Dr., Fulton, Md. 20759

[21] Appl. No.: 437,401

[22] Filed: Nov. 16, 1989

[51] Int. Cl.$^5$ .......................................... G01R 33/20
[52] U.S. Cl. ..................................... 324/316; 333/995
[58] Field of Search .............. 324/306, 307, 313, 314, 324/315, 316, 318, 322; 333/995; 128/653 A

[56] References Cited

U.S. PATENT DOCUMENTS

| | | |
|---|---|---|
| 4,674,513 | 6/1987 | Jasper, Jr. .......................... 128/653 |
| 4,870,052 | 9/1989 | Engler .................................... 505/1 |

OTHER PUBLICATIONS

"A Coaxial Microwave Cavity for Improved Electron Paramagnetic Resonance Sensitivity with Lossy Solvents", *Journal of Magnetic Resonance* by Robert Allendoerfer and James Carroll, Jr., 37, pp. 497–508 (1980).

M. A. Foster, "Magnetic Resonance in Medicine & Biology", Pentagon Press, copyright 1984.

*Primary Examiner*—Michael J. Tokar
*Attorney, Agent, or Firm*—Michael Zelenka

[57] ABSTRACT

The EPR instrument includes an X-band klystron used to generate microwave power that is transmitted to a superconductive waveguide cavity resonator. The cavity is placed between the pole pieces of a large d-c magnet and small a-c magnet coils energized by a modulation signal source. A microwave crystal detector detects RF energy outputted from the cavity. The detector output is amplified, rectified and filtered in a phase sensitive filter that uses the modulation signal source as a reference. The resultant signal is recorded by an amplitude vs. time recorder. The superconductive cavity includes an inner wall of high-temperature superconductive material, a liquid coolant and an insulating sleeve that passes through the cavity. The specimen to be analyzed is placed in the sleeve.

11 Claims, 2 Drawing Sheets

ELECTRON PARAMAGNETIC RESONANCE INSTRUMENT WITH SUPERCONDUCTIVE CAVITY

The invention described herein may be manufactured, used, and licensed by or for the Government for governmental purposes without the payment to me of any royalty thereon.

BACKGROUND OF THE INVENTION

1. Field of the Invention

The present invention relates to the field of electron paramagnetic resonance (EPR) instruments and, more particularly, to EPR instruments sufficiently sensitive to perform rapid, real time EPR measurements on large, lossy specimens.

2. Description of the Prior Art

Those concerned with measuring radiation damage to objects have, in many cases, successfully employed EPR techniques. Although prior art EPR devices have served the purpose, they have not proved entirely satisfactory under all conditions of service for the reason that considerable difficulty has been experienced in making rapid, real time EPR measurements on relatively large, lossy specimens.

For example, an urgent military need has long existed for instruments capable of making accurate, real-time determinations of radiation damage to a soldier having been exposed to gamma and/or neutron radiation. It is well known that such radiation breaks bonds between atoms in molecules. When the bonds are homolytically broken, free radicals result. The free radicals can be observed in an EPR spectrometer. Human components, such as the finger or tooth, are recognized as being potentially excellent samples to utilize for determining radiation damage to an individual. Free radicals in the bones resonate when exposed to microwaves at a frequency of about 9.5 GHZ (X-band). However, the inside dimensions of an X-bank waveguide are only 0.4 by 0.9 inches for 8.2 to 12.4 GHZ. An X-bank rectangular cavity has the same cross-section dimensions and a length equal to an integral number of $\frac{1}{2}$ guide wavelengths. It can be seen, therefore, that a finger would occupy a significant portion of an EPR X-bank cavity. As such, the size of a lossy sample is usually limited to only a few microliters for EPR measurements because larger, lossy samples would drastically reduce the Q of the cavity so that EPR measurements are impossible.

U.S. Pat. No. 4,674,513, entitled "Active Microwave Cavity for Electron Paramagnetic Resonance (EPR) Apparatus" discusses in detail many technical barriers that must be overcome before a large lossy item, such as a finger, can be utilized as an EPR sample. The apparatus disclosed in the '513 patent is directed to an EPR instrument wherein a microwave amplifier has an active X-bank cavity which can be utilized for making EPR measurements on a large size sample (<50 milliliters). The RF energy is transported into the cavity by an electron beam carrying an amplified RF wave. The RF wave is essentially "trapped" in the cavity because of the non-reciprocal nature of the electron beam medium and because the guide at the input to the cavity has dimensions such that the frequency of the RF microwave energy is below the guide's lower cut-off frequency. The "trapped" RF energy in the cavity generates large, narrow resonant peaks in the cavity and a cavity Q-factor greater than 1000 can be realized. Although the EPR instrument of the '513 patent solves the problem of making X-bank EPR measurements on large, lossy samples, it does so at the expense of using a substantial amount of additional power. Most of the additional power is needed to operate the electron beam apparatus. Also, the additional construction costs of the microwave amplifier and the active microwave cavity may be substantial due to the need for the generation and focusing of an electron beam in a vacuum.

The problems associated with designing EPR cavities are also discussed by Robert Allendoerfer and James Carroll, Jr. in an article entitled "A Coaxial Microwave Cavity for improved Electron Paramagnetic Resonance Sensitivity with Lossy Solvents", *Journal of Magnetic Resonance*, 37, pp. 497–508 (1980), incorporated herein by reference. In this article, the authors state on page 503 that the Q of a typical X-band TE011 cylindrical cavity is about 10,000 without a sample. When the optimum amount of the sample is added, the resulting loaded Q is about 1700, and this value is approaching the minimum value that spectrometers can use for EPR measurements. It is also noted that the optimum sample thickness is in the micron range which is much less than the thickness of a finger.

Therefore, those concerned with the development of EPR measurement apparatus have long recognized the need for a more sensitive device that can make accurate real-time measurements on large, lossy samples. The present invention fulfills this need.

SUMMARY OF THE INVENTION

The general purpose of this invention is to provide EPR measurement apparatus and components which embrace all the advantages of similarly employed conventional apparatus and possess none of the aforedescribed disadvantages. To attain this, the present invention contemplates increasing EPR measurement sensitivity with a unique high Q electromagnetic cavity resonator that can accept relatively large, lossy samples.

More specifically, the present invention contemplates a unique X-band cavity that has the inner surfaces thereof coated with a high temperature superconductive material. In some cases, the Q of the cavity may be increased from a conventional value of about $10^4$ to a value that is greater than $10^7$ (greater than three orders of magnitude). Accordingly, in the present invention, when a large, lossy sample is inserted into the superconductive cavity, the resulting loaded Q will be large enough to conduct EPR measurements.

It is, therefore, a primary object of the present invention to provide a high-Q microwave cavity for increasing EPR measurement sensitivity to permit large, lossy samples to be placed therein for EPR measurement.

Another object of the invention is to provide an EPR apparatus capable of determining free radicals of irradiated large samples.

A further object is to provide a highly sensitive EPR measurement system for the rapid, real time determination of the effects of radiation on individuals such as soldiers or others exposed to radiation.

Still another object of the invention is the provision of an EPR apparatus to determine EPR measurements of mammalian tissue and their relation to pathology.

Yet a further object is the provision of an EPR measurement system capable of use in making dielectric measurements and ferromagnetic resonance measurements on a variety of materials.

Other objects and many of the attendant advantages of this invention will be readily appreciated as the same becomes better understood by reference to the following detailed description when considered in connection with the accompanying drawings in which like reference numerals designate like parts throughout the figures thereof.

DETAILED DESCRIPTION OF THE PREFERRED EMBODIMENT

Figure 1:
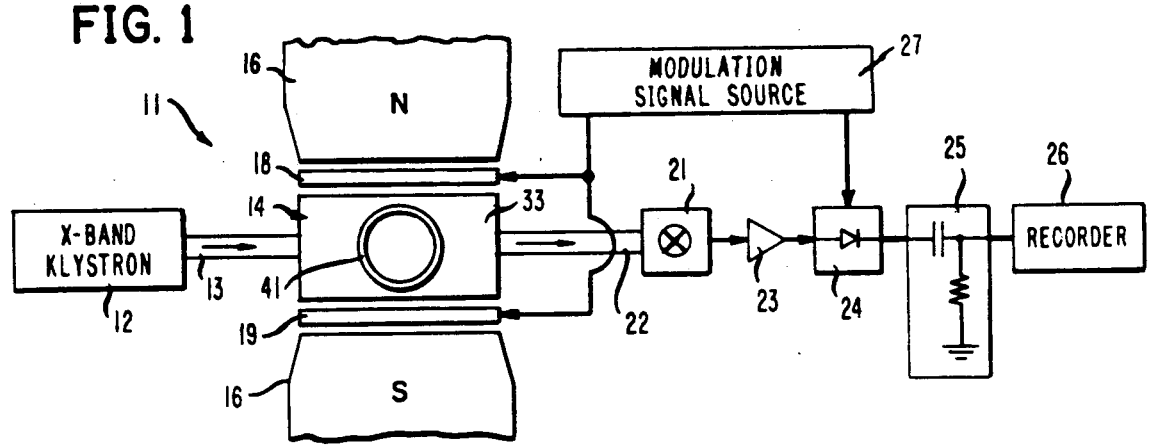
FIG. 1 is a block diagram of the EPR apparatus of the present invention.

Referring now to the drawings, there is shown an X-band EPR instrument 11 having a conventional klystron 12 for generating low level (e.g. tens of watts) microwave power at the desired frequency. The output power from klystron 12 is transmitted to a passive, microwave, superconductive cavity 14 by a conventional waveguide 13 which may be a stripline, a coaxial cable, a hollow waveguide or like device. The cavity 14 is placed between the pole pieces N, S of an electromagnet 16 which produces a d-c magnetic field of typically 2 to 4 kilogauss. A microwave crystal detector 21 is utilized to detect a low-power (30 milliwatts) RF signal from the output of the microwave cavity 14 via waveguide 22. Small modulation coils 18, 19 are placed on either side of the passive microwave cavity 14 between the cavity 14 and the pole pieces N, S of electromagnet 16. These coils 18, 19 add a small (tens of gauss) oscillating magnetic field to the large d-c magnetic field of magnet 16. The resultant magnetic field strength modulation swings back and forth, alternately increasing and decreasing the absorption height of microwave energy of a specimen placed in the cavity 14. These variations in absorption are detected by crystal detector 21 which provides an a-c output to be amplified by a-c amplifier 23 connected thereto. The amplified a-c is rectified by rectifier 24 and phase detected by a phase sensitive filter 25 relative to the phase of the modulation signal source 27 which energizes coils 18, 19. The resultant signal from filter 25 is then recorded by recorder 26 which may comprise a conventional amplitude vs. time recording device. The amplified a-c allows one to see the small absorption lines of the microwave power on top of the large d-c due to the EPR signal. The swing of the modulation field produces the observed derivatives of the absorption lines.

Using a conventional passive microwave cavity in place of superconductive cavity 14, an EPR instrument of the type shown in FIG. 1 can routinely analyze, at X-bank, lossy samples with volumes of only a few microliters. However, large, lossy samples with volumes of several (e.g. 50) milliliters, such as a finger, cannot be analyzed with a conventional microwave cavity because the resultant loaded quality factor Q of the cavity will be reduced below the minimum value of the system.

Figure 2:
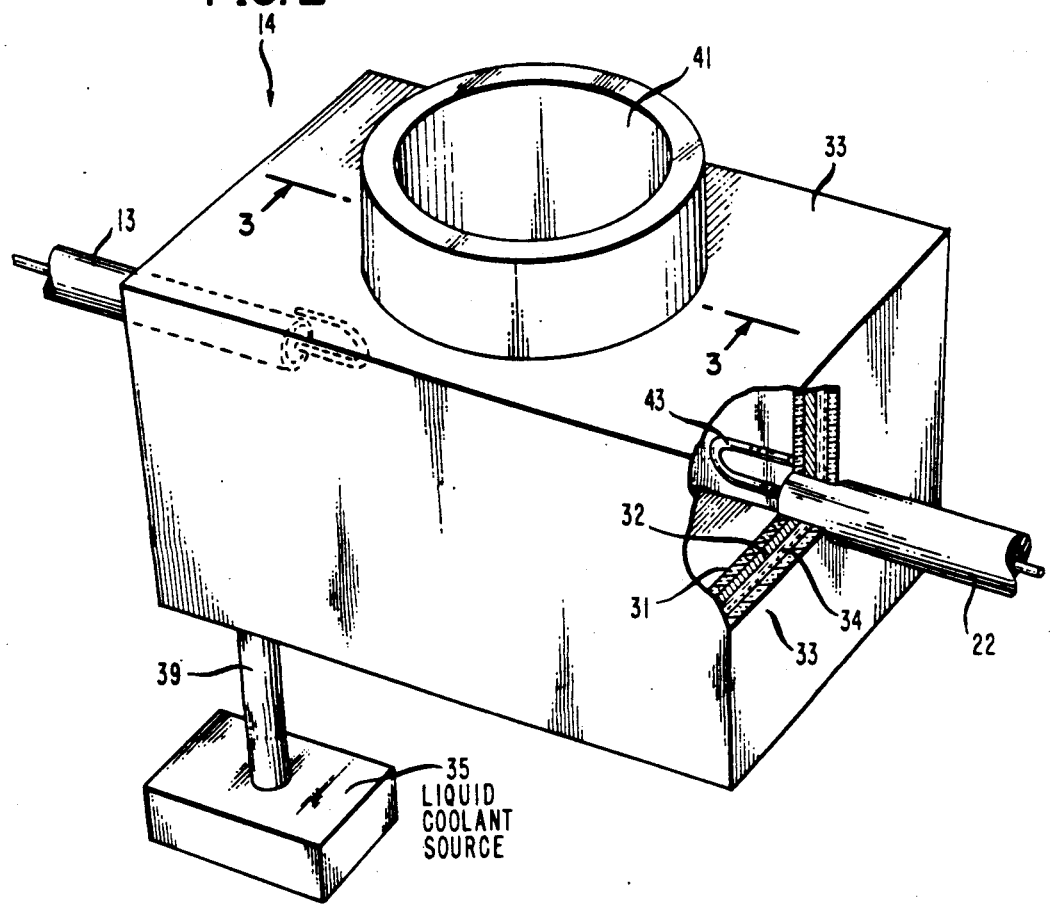
FIG. 2 is a pictorial, schematic representation of a portion of the device shown in FIG. 1.
Figure 3:
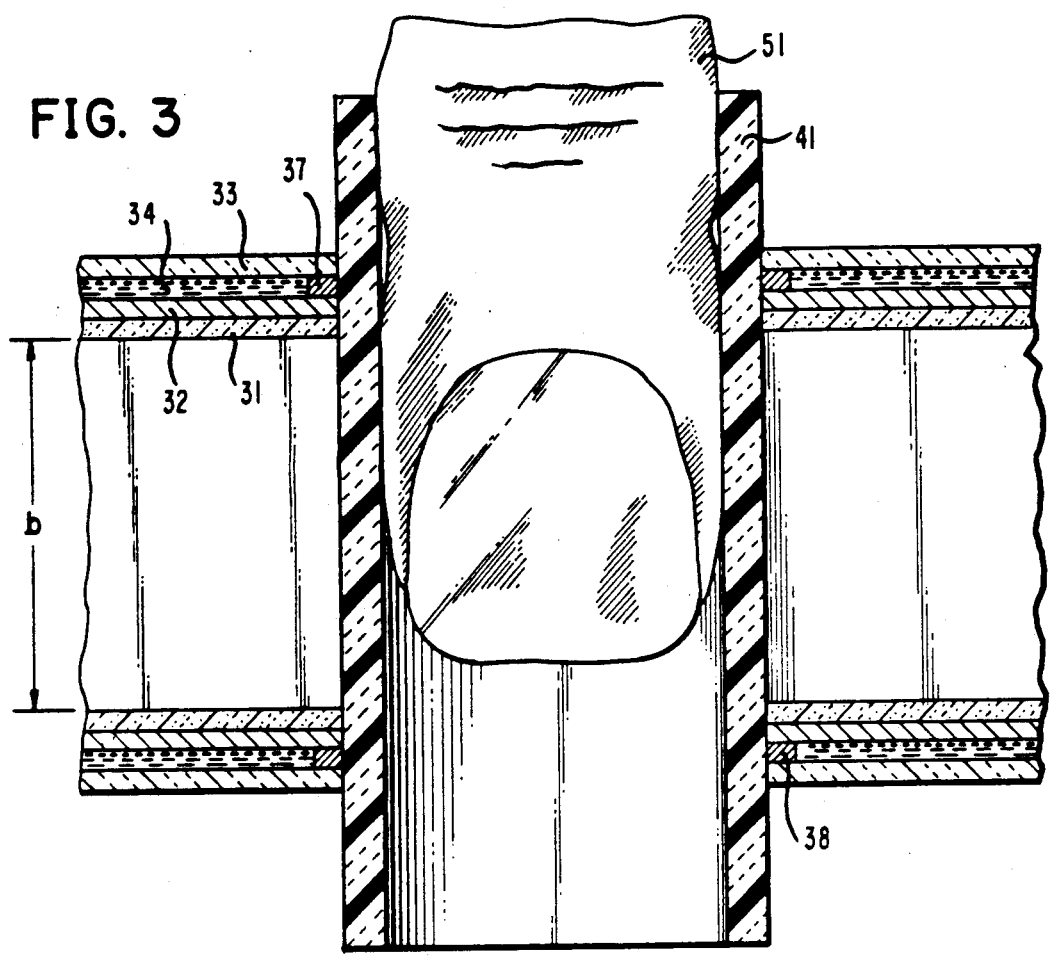
FIG. 3 is a diagrammatic front view in section taken on the line 3—3 of FIG. 4.
Figure 4:
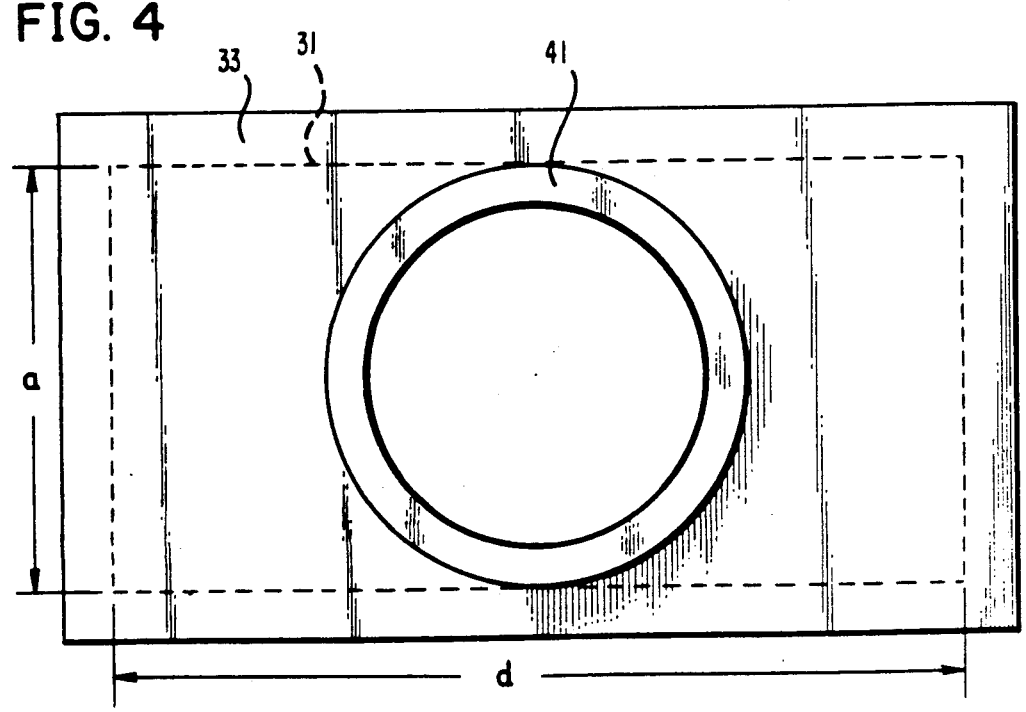
FIG. 4 is a diagrammatic top view of the device shown in FIG. 3.

In the present invention, the superconductive cavity 14 is designed to have an unloaded quality factor Q that is significantly higher than conventional EPR microwave cavities. FIGS. 2-4 show details of this microwave cavity 14. The cavity 14 is a rectangular cavity having inner wall dimensions "a", "b" and "d". The inner wall 31 is fabricated from a high-temperature superconductive material, such as the alloys and ceramics presently available that become superconductive at temperatures above the temperature of liquid nitrogen (U.S. Pat. No. 4,870,052).

Inner wall 31 is laminated onto a rigid, thermally conductive wall 32. A rigid outer wall 33 is concentrically spaced from inner wall 32 to form a suitable reservoir for containing a liquid coolant 34 such as liquid nitrogen that is supplied from a liquid coolant source 35 via a tube 39. Wall 33 is preferably made of a thermal insulator. The upper and lower sections of walls 31-33 have openings therein that are formed by rings 37, 38 that are fixed to the edges of walls 32, 33. The superconductive wall 32 overlaps the edges of rings 37, 38 to insure that the inner conductive surface is uniform.

A thin-walled, dielectric, cylindrical sleeve 41 extends through the openings defined by rings 37, 38 to a level beyond the upper and lower outer surfaces of wall 33. The cross-sectional shape of sleeve 41 may be circular or any other convenient shape to accommodate the specimen to be tested. The "little" finger 51 is shown in FIG. 3 extending about one-third its length into the sleeve 41 up to a point approximately level with the first joint. The cross-sectional shape of sleeve 41 is shown in FIG. 4 to be circular. The sleeve 41 is preferably made of a thermal insulator such as styrofoam to insulate the finger 51 from the cold temperature of the liquid coolant 34. The finger 51 need only remain in the sleeve 41 a short time (seconds) to enable a spectrometer reading to occur. Styrofoam is preferably because it is a low-loss, low dielectric thermal insulator that will not excessively load down the cavity 14.

Microwave energy is coupled into and out of the cavity 14 via an appropriate waveguide such as coaxial cables 13, 22 that terminate in conventional cavity exciters. As shown in FIG. 2, a waveguide probe extends through the walls 31-33 to excite the cavity 14 in the desired mode such as the TE102 mode. The inner coaxial conductor 43 is terminated in a loop connection to the inner wall 31 to form the waveguide probe.

The finger 51, or other sample to be analyzed, is located in the region of high RF fields. For the rectangular cavity 14 excited in the TE102 mode, this location is the geometric center of the cavity ($\frac{1}{2}$)a, ($\frac{1}{2}$)b and ($\frac{1}{2}$)d.

The loaded Q-factor of cavity 14 will be very large (order of $10^6$) primarily because of the negligible ohmic loss in the superconductive cavity wall 31. For organic radicals, it is known that the minimum number of spins detectable for EPR sensitivity is inversely proportional to the square root of the loaded Q-factor. Consequently, the larger the loaded Q-factor, the more sensitive will be the EPR measurement.

It is noted that the signal-to-noise ratio (S/N) can be adversely affected when a high-Q cavity is used because S/N is inversely proportional to Q. Random EM of the incident microwave power may be the principal noise source in the present spectrometer. Because the superconductive cavity 14 has a high Q-factor, reducing the FM noise will be vital to maintain sensitivity. Those skilled in these arts can readily reduce noise with the use of a noise-free (quiet), X-band klystron 12 or other microwave source, low incident microwave power and a properly selected cavity.

Obviously, many modifications and variations of the present invention are possible in the light of the above teachings. For example, the preferred embodiment was described with respect to a rectangular cavity 14 operating in the TE102 mode. Other embodiments of this invention will become obvious to those skilled in these arts which involve the use of other type cavities well known in the spectrometer field such as the cylindrical and coaxial cavities operating in various modes, viz. TE011, TM102, TM110, TE012, etc. It is therefore to be understood, that within the scope of the appended claims, the invention may be practiced otherwise than as specifically described.

What is claimed is:

1. An EPR instrument comprising:
a microwave power source;
a high-Q microwave resonant cavity having an inner surface of superconductive material coupled to said source and having an output;
a magnetic means for applying a variable magnetic field to said cavity; and
means for detecting RF power transmitted from the output of said cavity.

2. The instrument of claim 1 wherein said cavity includes an opening passing through the section of high RF power concentration.

3. The instrument of claim 2 wherein said cavity has a hollow wall surrounding the superconductive material and further includes a liquid coolant contained in said hollow wall having a temperature below the critical temperature of said superconductive material.

4. The instrument of claim 3 further including a dielectric insulating sleeve mounted in said opening.

5. The instrument of claim 4 wherein said power source is an X-band klystron.

6. The instrument of claim 4 wherein the loaded Q-factor for said resonant cavity is greater than $10^6$.

7. An EPR instrument comprising:
a microwave power source;
a microwave resonant cavity having an unloaded Q-factor much greater than $10^6$ wherein the inner surface of said cavity has substantially no resistance to electrical currents;
means for applying a variable magnetic field to said cavity; and
means for detecting RF power transmitted from the cavity.

8. The instrument of claim 7 wherein said cavity has means for placing a sample at the point of greatest RF power concentration in the cavity.

9. The instrument of claim 8 wherein said inner surface of said cavity is lined with a superconductive material.

10. The instrument of claim 9 wherein said cavity includes means for cooling said superconductive surface at least to the critical temperature thereof.

11. The instrument of claim 10 wherein said means for cooling includes a reservoir of liquid coolant surrounding said superconductive material.

* * * * *